United States Patent [19]

Gardner

[11] Patent Number: 5,386,088
[45] Date of Patent: * Jan. 31, 1995

[54] EMBEDDED GROUND PLANE AND SHIELDING STRUCTURES USING SIDEWALL INSULATORS IN HIGH FREQUENCY CIRCUITS HAVING VIAS

[75] Inventor: Donald S. Gardner, Mountain View, Calif.

[73] Assignee: Intel Corporation, Santa Clara, Calif.

[ * ] Notice: The portion of the term of this patent subsequent to Feb. 8, 2011 has been disclaimed.

[21] Appl. No.: 127,820

[22] Filed: Sep. 28, 1993

Related U.S. Application Data

[63] Continuation of Ser. No. 815,234, Dec. 31, 1991.

[51] Int. Cl.$^6$ ............................................. H05K 01/00
[52] U.S. Cl. ..................... 174/261; 174/264; 257/700; 361/795; 361/816
[58] Field of Search ............... 257/668, 684, 700, 703; 174/250, 255, 261, 262, 264, 35 R; 361/784, 790, 791, 792, 794, 795

[56] References Cited

U.S. PATENT DOCUMENTS

| | | |
|---|---|---|
| 4,023,197 | 5/1977 | Magdo et al. . |
| 4,628,406 | 12/1986 | Smith et al. . |
| 4,803,450 | 2/1989 | Burgess et al. . |
| 4,931,411 | 6/1990 | Tigelaar et al. . |
| 5,056,216 | 10/1991 | Madou et al. . |
| 5,079,670 | 1/1992 | Tigelaar et al. . |
| 5,126,794 | 6/1992 | Alumann . |
| 5,139,971 | 8/1992 | Giridhar et al. . |
| 5,165,166 | 11/1992 | Carey . |
| 5,210,379 | 5/1993 | Okonogi et al. . |
| 5,262,596 | 11/1993 | Kawakami et al. . |
| 5,285,017 | 2/1994 | Gardner .............. 174/261 |
| 5,308,929 | 5/1994 | Tani et al. . |

OTHER PUBLICATIONS

Hartmut Roskos, Martin C. Nuss, Keith W. Goossen, David W. Kisker, Alice E. White, Ken T. Short, Dale C. Jacobson, and John M. Poate, "Propagation of Picosecond Electrical Pulses on a Silicon-Based Microstrip Line With Buried Cobalt Silicide Ground Plane", Appl. Phys. Lett 58(23), 10 Jun. 1991, pp. 2604–2606.

Primary Examiner—Leo P. Picard
Assistant Examiner—Cheryl R. Figlin
Attorney, Agent, or Firm—Blakely, Sokoloff Taylor & Zafman

[57] ABSTRACT

A process for fabricating embedded ground plane and shielding structures using sidewall insulators in high frequency circuits having vias or contacts. A conductive ground plane disposed between two dielectric layers has vias formed in it by removing insulating dielectric and conductive ground plane material according to a single photolithography masking operation. A sidewall insulator formed on vertical sidewalls of the vias, electrically isolates the ground plane from interconnect metal passing from a lower interconnect layer to an upper interconnect layer through the vias. Alternatively, shielding structures incorporating multiple sidewall insulators and upper and lower shielding may be fabricated to entirely encapsulate the lower interconnect metal from external environments. Process efficency and yield are increased due to the simplified processing of the embedded ground plane and shielding structures.

47 Claims, 3 Drawing Sheets

Process Flow for Sidewall Insulator

| 1.  | Obtain [starting] substrate with completed underlying circuit processing |
|-----|---|
| 2.  | P-doped silicon dioxide (SiO$_2$) deposition (3000Å thick) |
| 3.  | Deposit 1000Å of aluminum for the ground plane |
| 4.  | P-doped silicon dixode (SiO$_2$) deposition (3000Å thick) |
| 5.  | Photolithography for layers deposited in 2, 3 and 4 |
| 6.  | Harden resist |
| 7.  | Contact oxide etch |
| 8.  | Ground plane metal etch |
| 9.  | Contact oxide etch |
| 10. | Plasma and/or wet photoresist removal |
| 11. | Silicon dioxide (SiO$_2$) deposition (3000Å thick) |
| 12. | Anisotropic etching of silicon dioxide (SiO$_2$) |
| 13. | Deposition of interconnect metal |
| 14. | Photolithography of interconnect metal deposited in step 13 |
| 15. | Subsequent insulating dielectric deposition |

Figure 4

EMBEDDED GROUND PLANE AND SHIELDING STRUCTURES USING SIDEWALL INSULATORS IN HIGH FREQUENCY CIRCUITS HAVING VIAS

This application is a continuation of Ser. No. 07/815,234 filed Dec. 31, 1991.

BACKGROUND OF THE INVENTION

1. Field of the Invention

The present invention relates to electronic circuits, and more particularly relates to high speed electronic circuits propagating high frequency signals.

2. Art Background

Electronic circuits, and in particular computer and instrumentation circuits, have in recent years become increasingly powerful and fast. Driven in large part by customer demand, present day computer circuits are many times, and in cases, several orders of magnitude faster than their prior generation counterparts. When circuit frequencies and signal waveforms are sufficiently low, inductive reactance is small and only the resistance and capacitance of wires is significant. Electronic components may be represented as lumped circuit elements. However, as dock frequencies and the associated propagated signals exceed frequencies of many tens of MHz, inductive reactance increases and capacitance reactance decreases. The electrical wires are more sensitive to the surrounding geometry and structure and are modeled using transmission lines. For example, electrical signals operating at high frequencies, including clock and data signals, emit electric fields from their associated datapaths which couple to and affect neighboring signals. In fact, interconnections are becoming the limiting factor in how fast electronic circuits may operate, especially in VLSI (Very Large Scale Integration) and ULSI (Ultra Large Scale Integration) circuits.

In order to enhance the speed and performance of high speed electronic circuits, ground planes are used to improve the propagation of signals along electrical pathways. As suggested above in connection with the surrounding geometry of high frequency signal propagation, ground planes are desirable because they help control the impedance presented to a signal propagating along a wire, thereby reducing crosstalk and reflections. Reflections can be caused by variations in surface topography as a signal path traverses over steps, and other physical boundaries, or by impedance discontinuities along the signal path. Ground planes ensure that reflections in signal datapaths from variations in geometry are minimized, and that signal line impedance does not vary substantially as the signal path traverses the circuitry. Further, because the high frequency electric field emitting from a given signal path using a ground plane is concentrated between that signal path and the ground plane, crosstalk between the given signal path and an adjacent signal path is commensurately reduced. Ground planes are frequently incorporated into high frequency electronic circuitry because they are effective in reducing crosstalk and reflections in high frequency signal paths. For example, ground planes are common place in electronic circuits operating at RF and microwave frequencies.

Although known in the prior art, fabrication of ground planes in electronic circuits remains cumbersome, requiring two distinct material deposition steps and two distinct patterning operations. In particular, a ground plane metal would typically be deposited upon a previously deposited dielectric layer, whereafter the ground plane metal is patterned and etched. Thereafter, a second dielectric layer is deposited, patterned, and etched in an appropriate fashion to insulate the ground plane metal. In order to make electrical contact with external control and data signals, metallic conductors that are below the ground plane metal must rise up and pass through the ground plane metallization without making physical contact to it. Where such underlying metallic conductors must pass through the ground plane, it is necessary to electrically insulate the conductor metal from the ground plane metal to prevent shorting. Accordingly, the "double deposition" and "double patterning" methods have been exclusively used in the prior art to insulate the metallic conductor passing through the ground plane metal. Patterning operations are complex in that they typically require a photolithographic process and etching process. The added complexity will have an effect on the yield of the product and in turn, the cost.

As will be explained in the following detailed description, the present invention discloses a new ground plane and sidewall insulator structure which may be used to singly or in combination to produce embedded ground planes or, alternatively, shielded conductor signal paths. Moreover, the present invention provides methods requiring fewer processing operations for producing an embedded ground plane using sidewall insulation for interconnections passing through the ground plane.

SUMMARY OF THE INVENTION

Embedded ground plane and shielding structures using sidewall insulators in high frequency electronic circuits using vias and methods for fabricating same are disclosed. In a first preferred embodiment, a first dielectric layer is deposited over underlying circuitry formed on a substrate. The underlying circuitry can include a deposited and patterned first metallic conductor layer. Thereafter, a first insulating dielectric layer is deposited, followed immediately by the deposition of a ground plane metal and a second insulating dielectric layer. A photoresist layer is then applied and patterned to define vertical interconnecting vias or contacts. All constituent layers of the embedded ground plane are etched using the defined photoresist. After the interconnecting vias have been opened using appropriate etching processes, a third insulating dielectric is deposited and anisotropically etched to produce vertically extending sidewall insulators within the previously opened vias or contacts. A second conductor metal is thereafter deposited, patterned, and etched. The second conductor metal fills the vias and forms an interconnected network of first and second metallic conductor signal and power paths joined by vias extending through and insulated from the embedded ground plane. Conducting paths may be alternatively fabricated in other ways including a "plug" process wherein a conducting material fills a via and then, using a separate deposition step, conducting material for the signal and power paths are patterned and etched.

In a second alternative preferred embodiment, the sidewall insulators may be fabricated multiple times to form shielded signal paths. A first dielectric layer is deposited over underlying circuitry formed on a substrate. A first insulating dielectric layer is then deposited, followed immediately by the deposition of a first shielding metal and a second insulating dielectric layer.

A photoresist layer is then applied and patterned to define vertical contact openings. All constituent layers of the first shielding metal structure are etched using the defined photoresist. After the contact openings have been opened using appropriate etching processes, a third insulating dielectric is deposited and anisotropically etched to produce vertically extending sidewall insulators within the previously opened contact openings. A first metallic conductor layer is thereafter deposited, whereafter a fourth insulating dielectric layer is immediately deposited. A second photoresist layer is then applied and patterned to define first layer interconnect traces together with this fourth dielectric layer. Thereafter, a fifth insulating dielectric layer is deposited and subsequently anisotropically etched to produce a second set of vertically extending sidewall insulators adjacent to the lateral edges of the first interconnect metal traces. A second shielding metal layer is next deposited followed immediately by a sixth insulating dielectric layer deposited above the second shielding metal. A third photoresist layer is applied and patterned to define vertically interconnecting vias. All constituent layers of the second shielding metal structure are etched using the third photoresist layer. After the interconnecting vias have been opened using appropriate etching processors, a seventh insulating dielectric layer is deposited and thereafter anisotropically etched to produce a third set of vertically extending sidewall insulators, located within the previously opened vias. A second metallic conductor layer is thereafter deposited, patterned, and etched, filling the vias and forming an interconnected network of first and second metallic conductor signals and power paths joined by vias extending through the shielding structure, surrounding the first metallic conductor traces. The first, second, and third sets of sidewall insulators permit shielding structures to completely surround conducting traces, thereby encapsulating signal traces from harmful environments.

BRIEF DESCRIPTION OF THE DRAWING

The present invention will be understood more fully from the detailed description given below and from the accompanying drawings of the preferred embodiment of the invention in which.

DETAILED DESCRIPTION OF THE INVENTION

An embedded ground plane with insulated vias and methods for fabricating same are disclosed. In the following detailed specification, numerous specific details are set forth, such as thicknesses, materials, etc., in order to provide a thorough understanding of the present invention. It will, however, be obvious to one skilled in the art that the present invention may be practiced without specific details. In other instances, well known processing steps and well known device structures have not been described in detail in order not to unnecessarily obscure the present invention. The reader will further note that the present invention may be embodied within microelectronic circuits (microchips), large multichip modules (MCM), or other circuits boards/structures that require ground planes and use vias.

Figure 1A:
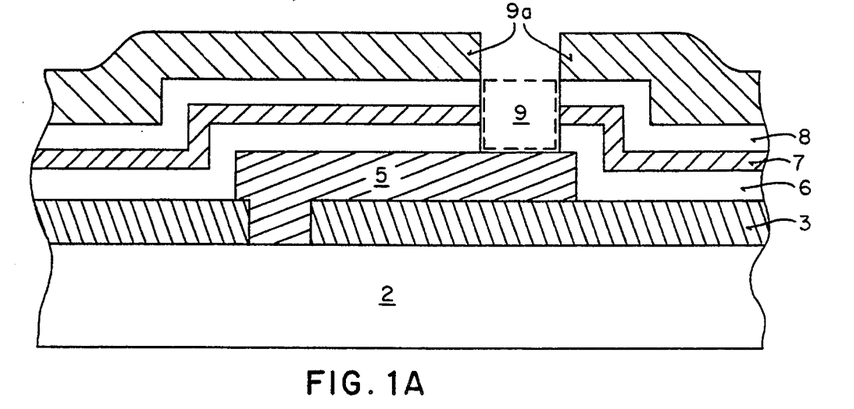
FIG. 1A illustrates a cross-sectional view of the fabrication of an embedded ground plane with insulating sidewalls, wherein a photoresist layer is used to define the multiple layers forming the embedded ground plane.

Referring now to FIG. 1A, a cross-sectional illustration of the preferred embodiment of the present invention is shown. In FIG. 1A, an embedded ground plane structure is formed upon a substrate 2, wherein for purposes of the present detailed description it is understood that substrate 2 integrally contains electronic circuitry elements and pathways. After processing of the base layer non-metallic circuitry is complete, an insulating dielectric 3 is deposited followed by a first interconnect metal layer 5. The thicknesses of dielectric layer 3 and interconnect metal layer 5 may be produced in any appropriate thickness for the specific application intended, and will not limit application of the present invention. As previously stated, it is intended that the present invention function equally well with microchip components as well as larger MCMs or printed circuit board applications. Following deposition of the first interconnect metal layer 5, it is patterned and etched to produce a multiplicity of interconnecting Metal 1 lines.

After the Metal 1 lines have been formed, a lower ground plane insulating dielectric layer 6 is deposited. Significantly, the present invention provides that the ground plane and the associated insulating dielectric layers are "self-aligned". That is, all layers forming the encapsulated ground plane will be deposited prior to any photolithographic definition of the ground plane. Accordingly, following deposition of the lower insulating dielectric layer 6, a suitable ground plane metal layer 7 and an upper insulating dielectric layer 8 are immediately deposited, without intervening photolithography and etching operations. In the presently preferred embodiment of the present invention, lower and upper insulating dielectric layers 6 and 8 are doped silicon dioxide (SiO$_2$), each of the layers being approximately 3000 angstroms thick. Unlike ground planes fabricated according to prior art methods, the present invention takes full advantage of the triple layer "sandwich" 15 formed by layers 6, 7, and 8 by providing that the constituent layers of sandwich 15 all be etched using a single photolithographic mask layer (not yet deposited). The foregoing is significant in that two photolithography steps are saved in the process, wherein each photolithography step actually entails multiple substeps. Processing cost and cycle time are accordingly reduced together with fabrication yield loss associated with photolithography.

With further reference to FIG. 1A, a photoresist layer 9a is next applied and defined where a via 9 will be formed. As seen in FIG. 1A, photoresist layer 9a permits subsequent consecutive etch processes to sequentially remove the deposited oxide, metal, and oxide layers 6, 7, and 8 where not masked by photoresist 9a. As presently preferred, three separate etch processes are used to etch, in order, layers 8, 7, and 6. However, it is anticipated that in certain circumstances all three layers could be etched with a suitable single etch process, or alternatively, three etch processes performed within in a single etcher or process module. One skilled in the art will appreciate that etching of the aforesaid layers 6, 7, and 8 may be accomplished in the appropriate fashion for the particular materials used for such layers, and the layers are not limited to the $SiO_2$ and aluminum materials specified in the preferred embodiment.

Figure 1B:
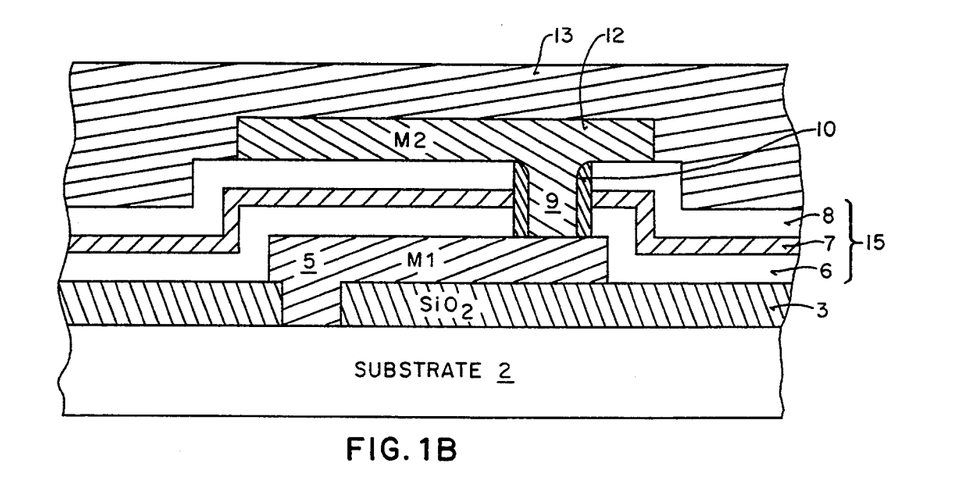
FIG. 1B illustrates a cross-section view of an embedded ground plane having sidewall insulators as provided by the present invention.

Reference is now made to FIG. 1B. Following the formation of via 9 by etching lower and upper dielectric layers 6 and 8 and the ground plane metal 7, the photoresist layer 9a is removed in a photoresist strip operation that can include plasma dry stripping and/or an appropriate wet strip. Thereafter, a suitable low temperature oxide (LTO) insulating dielectric layer 10 is deposited, and in the preferred embodiment consists of 3000 angstroms of silicon dioxide. The dielectric layer 10 will form vertically extending sidewall insulators for the embedded ground plane. The silicon dioxide forming layer 10 contains both phosphorus and boron trace impurities for purposes more definitively explained below. Following deposition of dielectric layer 10, an anisotropic sidewall etch process is performed over the entire surface of substrate 2, the etch being, in effect, a "blanket" etch. Intervening photolithography steps and processing are therefore unnecessary. The trace phosphorous and boron concentrations increase the etch rate of silicon dioxide forming dielectric layer 10, and ensure that dielectric layer 10 is removed from all horizontal surfaces, particularly the bottom of via 9. As above, the anisotropic sidewall etch may be optimized for any particular materials used and etch profile desired, and will not be discussed in detail. However, it is important to note that the sidewall etch process must be sufficiently anisotropic in order to retain the vertically oriented portions of dielectric layer 10 necessary to isolate the ground plane 7 from a second interconnect metal to be deposited, while simultaneously removing the sidewall insulator dielectric from the Metal 1 (formed of first interconnect metal layer 5) at the bottom of via 9. Accordingly, dielectric layer 10 will henceforth be referred to as sidewall insulator 10. Again, one skilled in the art will note that layer 10, as well as layers 6 and 8, are not limited to $SiO_2$ material, and that other insulating material combinations such as silicon nitride ($Si_3N_4$) and silicon oxynitride ($SiO_xN_y$) are possible.

Following formation of the sidewall insulator 10 within via 9, a second interconnect metal layer 12 is deposited. The second interconnect metal layer 12 is thereafter patterned and etched in a fashion similar to that employed for the first interconnect metal 5 to form a multiplicity of interconnecting Metal 2 lines. Importantly, the second interconnect metal layer 12 serves to fill the via 9 and thereby electrically connects the Metal 2 lines to the Metal 1 lines through the via 9. As can be seen in FIG. 1B, Metal 2 and Metal 1 are interconnected through the via 9 but are insulated from the ground plane 7 by sidewall insulator 10, which in cross-section view appears on each side of the second interconnect metal layer 12 extending through the via 9 and contacting the first interconnect metal layer 5 below. Conducting paths may be alternatively fabricated, including a "plug" process, wherein a conducting material is deposited to fill a via, and then separately depositing and patterning another conducting material for the signal and power paths.

Finally, an encapsulating dielectric passivation layer 13 is deposited over all layers for subsequent levels of interconnections or to guard against harmful external environments. The above described process for producing embedded ground planes having sidewall insulators permits ground planes to extend over substantially the entire surface of the substrate, and yet simplifies fabrication of such an embedded ground plane by eliminating two unneeded process steps used in prior art methodologies. Using a single photoresist mask to define the upper and lower insulating dielectrics 6 and 8, as well as the via 9 within the ground plane 7 ensures that all levels will be self-aligned to via 9 in addition to being more efficiently fabricated. In the present invention, self-aligned dielectric layers 8 and 6 and ground plane layer 7 produce collinear edges, wherein the edge of each layer is precisely coincident with the edge of an adjoining layer in the triple layer sandwich A significant and principal benefit of the self-aligned edges is that, in contrast to prior art multiple masking operations used in via fabrication, the present invention eliminates entirely shorting of the ground plane 7 to the second metal layer 12 deposited within via 9 due to misalignment of the ground plane 7 and dielectric layers 6 and 8 induced by separate photolithography masking operations. Overall fabrication yield is therefore enhanced.

Figure 2:
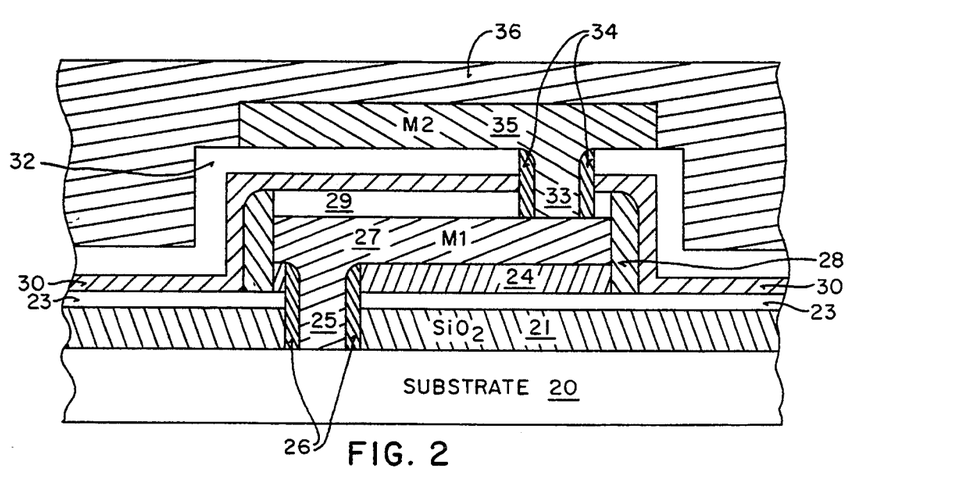
FIG. 2 illustrates a second alternative embodiment of the present invention, wherein multiple combinations of sidewall insulators are combined to form an encapsulating shield for an embedded conductor layer.

The embedded ground plane can also be fabricated within the insulating layer 3 or within the insulating layer 13 with accompanying sidewall insulators. Referring now to FIG. 2, a second alternative embodiment of the present invention is shown. The fabrication of a sidewall insulator is identical in the embodiment shown in FIG. 2 as in FIG. 1 discussed above, except that the fabrication steps are repeated in order to form duplicate or multiple pairs of sidewall insulators to entirely surround an embedded metallic conductor. The purpose of the multiple sidewall insulators in the second alternative embodiment illustrated in FIG. 2 is to provide in essence a "shield" to encapsulate critical signal pathways. In FIG. 2, a substrate containing non-metallic circuit definitions receives a first insulating dielectric layer 21, followed immediately by deposition of a first ground plane metal 23 and a second insulating dielectric layer 24. First and second dielectric layers 21 and 24, and first ground plane metal 23, together comprise a first triple layer sandwich layer. A first interconnecting via 25 is fabricated according to the process described in accordance with the First embodiment discussed above, wherein a photoresist layer is applied and all three layers 21, 23, and 24 etched, and whereafter a First sidewall insulator 26 is formed on the sidewalls of the via 25. A first interconnecting metal layer 27 is next deposited, followed immediately by a third dielectric insulating layer 29. Dielectric layer 29 and interconnect metal 27 are subsequently patterned together and then etched using the same photoresist layer with appropriate photolithography and etching operations to form Metal 1 lines which are to be shielded. Importantly, the reader should note that dielectric layers 24 and 29 and interconnect metal 27 form a second triple layer sandwich layer similar to the first triple layer sandwich described above, wherein the lateral edges of insulating dielectric layers 29 and interconnect metal 27 are collinear and coincident with each other.

Following definition of layers 24, 27, and 29, a second sidewall insulator 28 is formed on the lateral edges of interconnect metal 27, in a fashion identical to that described with respect to sidewall insulator 26 above. Thus, at this point in the processing, Metal 1 line formed of interconnect metal 27 is insulated from the ground plane below it and now has sidewall insulator 28 on each lateral side of it formed using an anisotropic etch step. Thereafter, a second ground plane metal 30 is deposited, followed immediately by a fourth dielectric insulating layer 32. Dielectric layers 29, 32, and ground plane metal 30 are subsequently photolithographically defined and etched in a manner similar to the previous definitions described, forming a third triple layer sandwich structure above the interconnect metal 27. Following the definition and etching of layers 29, 30, and 32, a third sidewall insulator 34 is created in the fashion identical to insulating sidewall structures 28 and 26. Specifically, a photoresist mask is first applied above the fourth insulating dielectric layer 32 whereafter the photoresist is exposed to define a second via 33 through layers 29, 30, and 32. After the photoresist has been appropriately defined, the via 33 is opened with suitable etch processes for the insulating dielectric layers 29 and 32 and the second ground plane metal 30. Thereafter, the third LTO dielectric layer 34 is deposited, after which a blanket anisotropic etch removes all of the LTO except on the vertical walls of the previously formed via A second interconnect metal layer 35 is then deposited above the fourth insulating dielectric layer 32 and into the previously opened via 33. The second interconnect metal layer 35 is subsequently defined and etched to form Metal 2 tines for individual signal pathways. Finally, an encapsulating insulating dielectric 36 is deposited over the entire structure. As illustrated in FIG. 2, the multiple sidewall structures thus formed electrically insulate the Metal 1 lines from ground plane layers 23 and 30 forming the encapsulating shield as alluded to above. In particular, the first interconnect metal layer 27 is entirely surrounded by insulating dielectric layers 24, 26, 28, and 29. The added benefit of the second alternative embodiment is that environmentally sensitive metals or signal paths unusually sensitive to electromagnetic interference used for the first interconnect layer 27 may be essentially "hermetically sealed" within the aforesaid layers, thereby adding an additional margin of safety and insulation.

The insulating sidewalls as discussed above in connection with FIGS. 1B and 2 further possess the additional benefit that they are self-verifying. In both cases, because the sidewall insulator structures are deposited separately and are distinct from the laterally extending insulating dielectric layers, the vertically extending sidewall insulators may be visually verified using any of several known cross-sectional imaging techniques. In particular, the separately deposited insulating dielectric layers will be seen as distinct structures, permitting the manufacturer of components incorporating the embedded ground plane of the present invention to verify whether products manufactured by another employ either the process or the sidewall structure of the present invention.

Figure 3A:
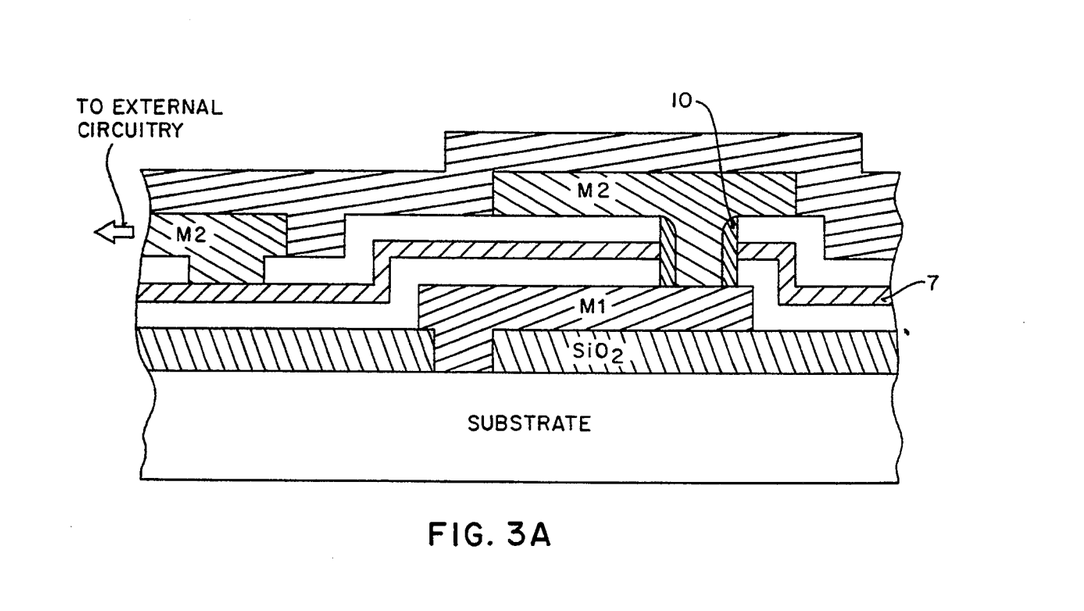
FIG. 3A illustrates a cross-sectional view of the present invention wherein contact metallization is made to the ground plane by Metal 2.
Figure 3B:
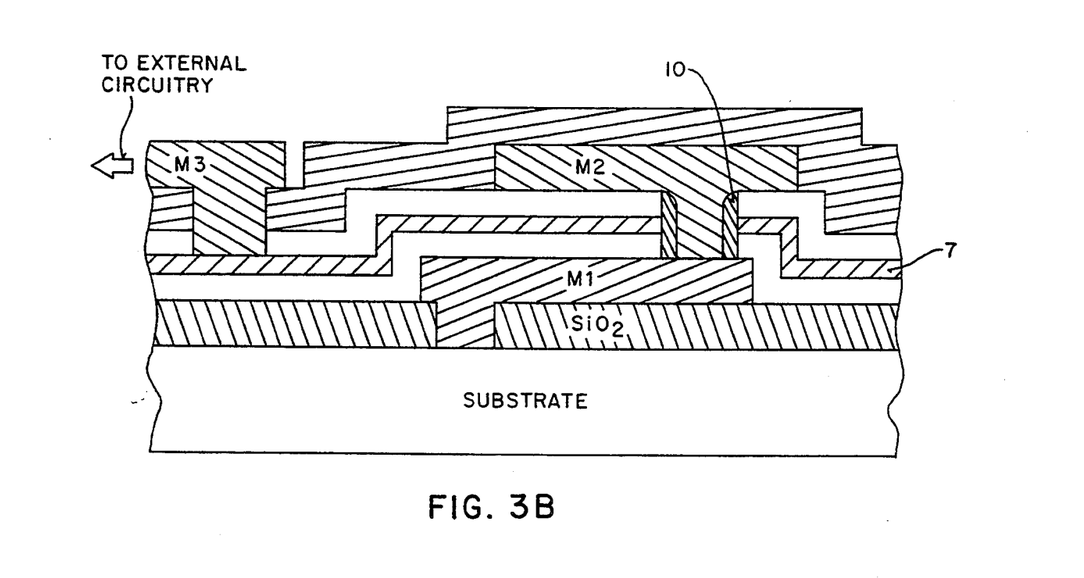
FIG. 3B illustrates a cross-sectional view of the present invention where contact metallization is made to the ground plane by Metal 3.

With brief reference to FIGS. 3A and 3B, alternative methods of making electrical contact with the ground plane of the first alternative embodiment illustrated in FIG. 1A are shown. However, such connections may not be necessary because of the large capacitance of the ground plane. In FIG. 3A, Metal 2 is shown to interconnect to Metal 1 lines through via 9 as well as provide contact metallization for external circuitry. An extra photolithographic step may be necessary to produce the Metal 2 contact metallization shown in FIG. 3A. In FIG. 3B, contact metallization to external circuitry is made by a separately deposited Metal 3 layer (M3), Metal 2 being reserved only for interconnecting to Metal 1 layers below.

Figure 4:
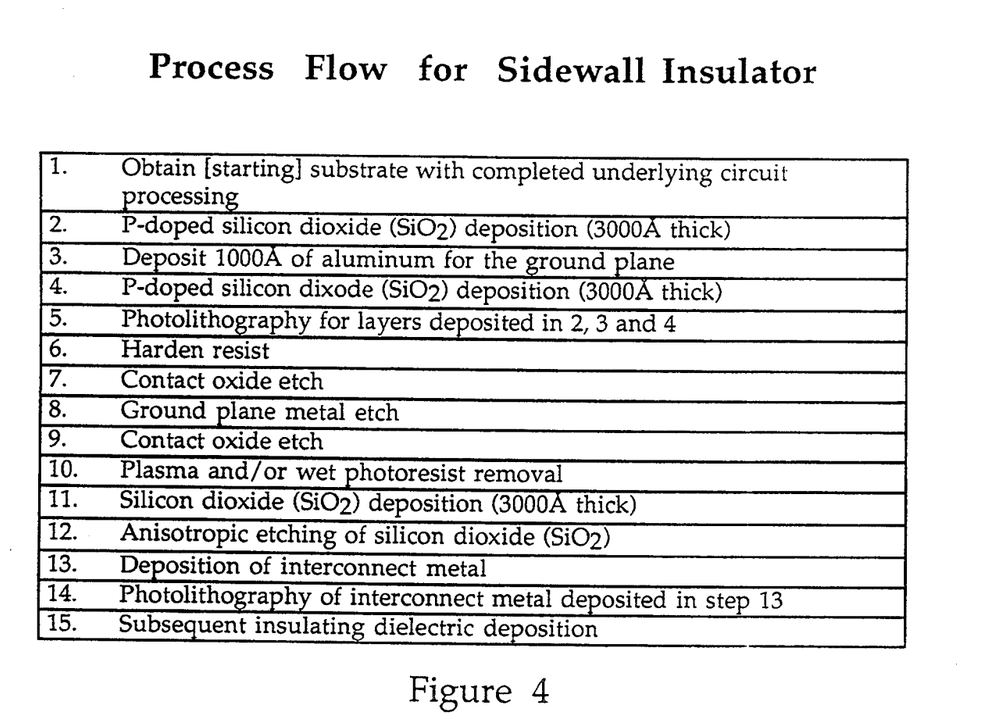
FIG. 4 is an exemplary process flow-chart specifying the operations to produce the embedded ground plane with vias having sidewall insulators.

Referring now to FIG. 4, generalized exemplary process flow specifications to fabricate embedded ground planes with insulating sidewall structures are shown. The process flow described in FIG. 4 is that employed to fabricate one sidewall insulator as shown in FIG. 1A above. Multiple sidewall insulator pairs forming a shielding structure as illustrated in FIG. 2 may be obtained by repeating the appropriate fabrication operations. Nominal dimensions for process specifications have been provided, but are intended for illustration purposes only, and are not intended as limits on the scope of the present invention. Further, it is anticipated that process materials other than those specifically described in FIG. 4 may be utilized to obtain the insulated ground plane structures of the present invention.

The foregoing has described two alternative embodiments of an embedded ground plane structure using sidewall insulators with an optimized processing methodology. The processing steps described used to produce the embedded ground plane structure reduce process complexity and associated costs and cycle time, as well as improve the fabrication yield due to the reduced processing required by the present invention. It is contemplated that changes and modifications may be made by one of ordinary skill in the art, to the materials and arrangements of elements of the present invention without departing from the spirit and scope of the invention.

I claim:

1. An embedded ground plane structure formed on a substrate, comprising:
   a first dielectric layer deposited upon said substrate;
   a first electrically conductive layer deposited upon said first dielectric layer, said first electrically conductive layer comprising a first ground plane layer;
   a second dielectric layer deposited upon said first electrically conductive layer; and,
   at least one first opening formed in said first dielectric layer, said first electrically conductive layer and said second dielectric layer, said first opening having a sidewall, said sidewall having a third dielectric layer deposited thereon.

2. The embedded ground plane structure as set forth in claim 1, further comprising an interconnect metal layer disposed above said second dielectric layer.

3. The embedded ground plane structure as set forth in claim 2, wherein said first openings comprise a conductive material, said conductive material electrically coupling an underlying region of said substrate and said interconnect metal layer.

4. The embedded ground plane structure as set forth, in claim 3, wherein said interconnect metal layer comprises said conductive material.

5. The embedded ground plane structure as set forth in claim 3 wherein said first and second dielectric layers comprise a material selected from the group consisting of phosphorous-doped low temperature silicon dioxide, low temperature silicon nitride, and low temperature silicon oxynitride.

6. The embedded ground plane structure as set forth in claim 3, wherein said third dielectric layer comprises low temperature silicon dioxide doped with phosphorous and boron.

7. The embedded ground plane structure as set forth in claim 4, wherein said interconnect metal layer and said first ground plane metal layer comprise a material selected from the group consisting of aluminum and tungsten.

8. An embedded ground plane structure formed on a substrate having at least first and second interconnect metal layers disposed thereon, said embedded ground plane structure disposed between said first and second interconnect metal layers, said ground plane structure comprising:

a first dielectric layer deposited upon said first interconnect metal layer:

a first ground plane layer deposited upon said first dielectric layer;

a second dielectric layer deposited upon said ground plane layer:
and, at least one first opening formed in said first dielectric layer said first ground plane layer and said second dielectric layer, said first opening having a sidewall, said sidewall having a sidewall insulator deposited thereon;

said second interconnect metal layer subsequently deposited upon said second dielectric layer, said second interconnect metal layer further filling said first opening and contacting said first interconnect metal layer therethrough;

said sidewall insulators electrically isolating said first ground plane layer from said second interconnect metal layer deposited into said first opening.

9. The ground plane structure as claimed in claim 8 wherein said first and second dielectric layers comprise a material selected from the group consisting of phosphorous-doped low temperature silicon dioxide, low temperature silicon nitride, and low temperature silicon oxynitride.

10. The embedded ground plane structure as set forth in claim 8, wherein said third dielectric layer comprises low temperature silicon dioxide doped with phosphorous and boron.

11. The embedded ground plane structure as set forth in claim 1, wherein said first and second interconnect metal layers and said first ground plane layer comprise a material selected from the group consisting of aluminum and tungsten.

12. A method embedding a ground plane structure comprising the steps of:

depositing a first dielectric layer upon a substrate;
depositing a first electrically conductive layer upon said first dielectric layer;
depositing a second dielectric layer upon said first electrically conductive layer;
forming a patterning layer on said second dielectric layer, said patterning layer having at least one patterning layer opening therein; and,
etching said first dielectric layer, said first electrically conductive layer and said second dielectric layer to form at least one first opening in said first and second dielectric layer and said first electrically conductive layer corresponding to said patterning layer opening, said first opening having a sidewall.

13. The method as set forth in claim 12, further comprising the step of depositing an interconnect metal layer above said second dielectric layer.

14. The method according to claim 13, further comprising the steps of:
depositing a third dielectric layer on said second dielectric layer and in said first opening
anisotropically etching said third dielectric layer, except for a portion of said third dielectric layer disposed on said sidewall, to form a sidewall insulator, said sidewall insulator electrically insulating said first electrically conductive layer from said interconnect metal layer.

15. The method according to claim 14, wherein providing said interconnect metal layer comprises filling said first opening and electrically contacting said substrate.

16. The method as set forth in claim 15, wherein depositing said first electrically conductive layer comprises depositing a first ground plane layer.

17. The method according to claim 16, wherein depositing said first and second dielectric layers comprises depositing a material selected from the group consisting of low temperature silicon dioxide, low temperature silicon nitride and low temperature silicon oxynitride.

18. The method as set forth in claim 16, wherein providing said third dielectric layer comprises depositing low temperature silicon dioxide doped with phosphorous and boron.

19. The method according to claim 16, wherein providing said interconnect metal layer and said first ground plane metal layer comprises depositing first and second layers comprising a material selected from the group consisting of aluminum and tungsten.

20. An embedded shielding structure formed on a substrate, said embedded shielding structure comprising:

first, second, fourth, and sixth dielectric layers deposited upon said substrate;
a first electrically conductive layer deposited between said first and second dielectric layers, and a second electrically conductive large deposited between said fourth and sixth dielectric layers;
first and second interconnect metal layers;
said first interconnect metal layer disposed between said second and fourth dielectric layers, said second interconnect metal layer disposed on said sixth dielectric layer, said first and said second interconnect metal layers each having an edge; and
a fifth dielectric layer disposed along said edge of said first interconnect metal layer, and insulating said first interconnect metal layer from, said second electrically conductive layer.

21. The embedded shielding structure according to claim 20, further comprising a third dielectric layer disposed on a sidewall of at least one first opening in said first and second dielectric layers and said first electrically conductive layer, said third dielectric layer surrounding portions of a first conductive material extending through said first and second dielectric layers and said first electrically conductive layer, said first conductive material electrically coupling said first interconnect metal layer and an underlying region of said substrate.

22. The embedded shielding structure according to claim 20, wherein said fifth dielectric layer adjoins and extends substantially orthogonal to lateral edges of said second and fourth dielectric layers and said first interconnect metal layer, said fifth dielectric layer further disposed between said second electrically conductive layer and said lateral edges of said second and fourth dielectric layers and said first interconnect metal layer.

23. The embedded shielding structure according to claim 21, further comprising a seventh dielectric layer disposed on a sidewall of at least one second opening in said fourth and sixth dielectric layers and said second electrically conductive layer, said seventh dielectric layer surrounding portions of a second conductive material extending through said fourth and sixth dielectric layers and said second electrically conductive layer said second conductive material electrically coupling said second interconnect metal layer and said first interconnect metal layer.

24. The embedded shielding structure as set forth in claim 21, wherein said first interconnect metal layer comprises said first conductive material.

25. The embedded shielding structure as set forth in claim 24, wherein said first electrically conductive layer comprises a first shielding layer.

26. The embedded shielding structure as set forth in claim 25, wherein said first shielding layer comprises a First metal encapsulating layer.

27. The embedded shielding structure as set forth in claim 23, wherein said second interconnect metal layer comprises said second conductive material.

28. The embedded shielding structure as set forth in claim 20, wherein said second electrically conductive layer comprises a second shielding layer.

29. The embedded shielding structure as set forth in claim 28 wherein said second electrically conductive layer comprises a second metal encapsulating layer.

30. The embedded ground plane structure as set forth in claim 20, wherein said first, second, fourth and sixth dielectric layers comprise a material selected from the group consisting of low temperature silicon dioxide, low temperature silicon nitride, and low temperature silicon oxynitride.

31. The embedded ground plane structure as set forth in claim 23, wherein said third, fifth and seventh dielectric layers comprise low temperature silicon dioxide doped with phosphorous and boron.

32. The embedded ground plane structure as set forth in claim 20, wherein said first and second shielding metal layers, and said first and second interconnect metal layers, comprise a material selected from the group consisting of aluminum and tungsten.

33. An embedded shielding structure formed on a substrate, said embedded shielding structure comprising:
a first dielectric layer deposited upon said substrate;
an electrically conductive first shielding layer deposited upon said first insulating dielectric layer;
a second dielectric layer deposited upon said first shielding layer;
a third dielectric layer disposed on a sidewall of at least one first opening in said first and second dielectric layers and said first shielding layer, said third dielectric layer surrounding portions of a first conductive material extending through said first and second dielectric layers and said first shielding layer and electrically contacting said substrate;
a first interconnect metal layer disposed upon said second and third dielectric layers and electrically coupled to said first conductive material;
a fourth dielectric layer deposited upon said first interconnect metal layer; an electrically conductive second shielding layer deposited upon said fourth dielectric layer;
a fifth dielectric layer adjoining and extending substantially orthogonal to lateral edges of said second and fourth dielectric layers and said first interconnect metal layer;
said fifth dielectric layer further disposed between said second shielding layer and lateral edges of said second and fourth dielectric layers and said first interconnect metal layer;
a sixth dielectric layer deposited upon said second shielding layer; and
a seventh dielectric layer disposed on a sidewall of at least one second opening in said fourth and sixth dielectric layers and said second shielding layer, said seventh dielectric layer surrounding portions of a second conductive material extending through said fourth and sixth dielectric layers and said second shielding layer and electrically contacting said first interconnect 34. The embedded shielding structure as set forth in claim 33, wherein said first interconnect metal layer comprises said first conductive layer. metal layer.

35. The embedded shielding structure as set forth in claim 34, wherein said first shielding layer comprises a rust metal layer.

36. The embedded shielding structure as set forth in claim 33, wherein said second shielding layer comprises a second metal layer.

37. The embedded shielding structure as set forth in claim 33, wherein said second interconnect metal layer comprises said second conductive material.

38. The embedded shielding structure as set forth in claim 33, wherein said first, second, fourth, and sixth dielectric layers comprise a material selected from the group consisting of phosphorous-doped low temperature silicon dioxide, low temperature silicon nitride, and low temperature silicon oxynitride.

39. The embedded shielding structure as set forth in claim 33 wherein said third, fifth, and seventh dielectric layers comprise low temperature silicon dioxide doped with phosphorous and boron.

40. The embedded shielding structure as set forth in claim 33, wherein said first and second shielding layers comprise a material selected from the group consisting of aluminum and tungsten.

41. The embedded shielding structure as set forth in claim 33, wherein said first and second interconnect metal layers comprise a material selected from the group consisting of aluminum and tungsten.

42. A method for embedding an encapsulating shielding structure comprising the steps of:
providing a substrate;
depositing a first dielectric layer on said substrate;
depositing a first electrically conductive layer on said first dielectric layer;
depositing a second dielectric layer on said first electrically conductive layer;
forming a first patterning layer on said second dielectric layer, said first patterning layer having at least one first patterning layer opening therein;
etching said first dielectric layer, said first electrically conductive layer and said second dielectric layer to form at least one first opening in said first and second dielectric layers and said first electrically conductive layer corresponding to said first patterning layer opening, said first opening having a sidewall;

depositing a third dielectric layer on said first opening sidewall;

depositing a first conductive material in said first opening, said first conductive material being electrically coupled to an underlying region of said substrate;

depositing a first interconnect metal layer on said second dielectric layer and electrically coupled to said first conductive material;

depositing a fourth dielectric layer on said first interconnect metal layer;

depositing a fifth dielectric layer along an edge of said second and fourth dielectric layers and said first interconnect metal layer;

depositing a second electrically conductive layer on said fourth dielectric layer;

depositing a sixth dielectric layer on said second electrically conductive layer;

forming a second patterning layer on said sixth dielectric layer, said second patterning layer having at least one second patterning layer opening thereby;

etching said sixth dielectric layer, said second electrically conductive layer and said fourth dielectric layer to form at least one second opening in said fourth and sixth dielectric layers and said second electrically conductive layer corresponding to said second patterning layer opening, said second opening having a sidewall;

depositing a seventh dielectric layer on said second sidewall;

depositing a second conductive material in said second opening, said second conductive material being electrically coupled to said first metal interconnect layer;

depositing a second metal interconnect layer on said sixth dielectric layer and electrically coupled to said second conductive material.

43. The method as set forth in claim 42, wherein said first electrically conductive layer comprises a first shielding layer and said second electrically conductive layer comprises a second shielding layer.

44. The method as set forth in claim 43, wherein said first shielding layer comprises a first metal encapsulating layer and said second shielding layer comprises a second metal encapsulating layer.

45. The method as set forth in claim 42, wherein depositing said first, second, fourth, and sixth dielectric layers comprises depositing a material selected from the group consisting of phosphorous-doped low temperature silicon dioxide, low temperature silicon nitride, and low temperature silicon oxynitride.

46. The method as set forth in claim 42, wherein depositing said third, fifth, and seventh dielectric layers comprises depositing low temperature silicon dioxide doped with phosphorous and boron.

47. The method as set forth in claim 42, wherein providing said first and second shielding metal layers, and said first and second interconnect metal layers, comprises depositing a material selected from the group consisting of aluminum and tungsten.

* * * * *

UNITED STATES PATENT AND TRADEMARK OFFICE
CERTIFICATE OF CORRECTION

PATENT NO. : 5,386,088
DATED : January 31, 1995
INVENTOR(S) : Donald S. Gardner It is certified that error appears in the above-identified patent and that said Letters Patent is hereby corrected as shown below:

ON THE TITLE PAGE:

In the Abstract at [57] in lines 15-16 delete "efficency" and insert --efficiency--

In column 7 at line 29 insert --33.-- after "via".

In column 7 at line 34 delete "tines" and insert --lines--

Signed and Sealed this

Tenth Day of June, 1997

Attest:

BRUCE LEHMAN

Attesting Officer

Commissioner of Patents and Trademarks